US011146249B2

(12) United States Patent
Kuperman (10) Patent No.: US 11,146,249 B2
(45) Date of Patent: Oct. 12, 2021

(54) ACTIVE ELECTRONIC EMULATION OF A PASSIVE CIRCUIT COMPONENT

(71) Applicant: Ariel Scientific Innovations Ltd., Ariel (IL)

(72) Inventor: Alon Kuperman, Ashdod (IL)

(73) Assignee: Ariel Scientific Innovations Ltd., Ariel (IL)

( * ) Notice: Subject to any disclaimer, the term of this patent is extended or adjusted under 35 U.S.C. 154(b) by 0 days.

(21) Appl. No.: 16/334,759

(22) PCT Filed: Oct. 2, 2017

(86) PCT No.: PCT/IL2017/051119
§ 371 (c)(1),
(2) Date: Mar. 20, 2019

(87) PCT Pub. No.: WO2018/061016
PCT Pub. Date: Apr. 5, 2018

(65) Prior Publication Data
US 2019/0238118 A1    Aug. 1, 2019

Related U.S. Application Data

(60) Provisional application No. 62/403,153, filed on Oct. 2, 2016.

(51) Int. Cl.
*H03H 11/48*    (2006.01)
*H02M 1/14*    (2006.01)

(52) U.S. Cl.
CPC .............. *H03H 11/48* (2013.01); *H02M 1/14* (2013.01); *H03H 11/481* (2013.01)

(58) Field of Classification Search
CPC ..................................................... H03H 11/48
See application file for complete search history.

(56) References Cited

U.S. PATENT DOCUMENTS

2010/0027304 A1    2/2010    Wang et al.
2012/0105135 A1    5/2012    Halberstadt
2014/0172343 A1    6/2014    Pelz et al.

FOREIGN PATENT DOCUMENTS

| CN | 103312136 | 9/2013 |
| WO | WO 2016/110254 | 7/2016 |
| WO | WO 2018/061016 | 4/2018 |

OTHER PUBLICATIONS

Liu, W., Wang, K., Chung, H. S. H., & Chuang, S. T. H. (2014). Modeling and design of series voltage compensator for reduction of DC-link capacitance in grid-tie solar inverter. IEEE transactions on power electronics, 30(5), 2534-2548. (Year: 2014).*

(Continued)

*Primary Examiner* — Bijan Mapar (57) ABSTRACT

An electronic emulation component for actively emulating a passive electronic component such as a capacitor or inductor having a desired value, comprises a pair of terminals for connection to an external circuit and across which the desired value is to appear, a power convertor, and a passive electronic component of the type to be emulated but having a value different from the value to be emulated and isolated from the pair of terminals by the convertor.

21 Claims, 4 Drawing Sheets

(56) References Cited

OTHER PUBLICATIONS

Wikipedia, Capacitor, May 22, 2016, retrieved from https://en.wikipedia.org/w/index.php?title=Capacitor&oldid=721544108 (Year: 2016).*

Sun, Y., Liu, Y., Su, M., Li, X., & Yang, J. (2015). Active power decoupling method for single-phase current-source rectifier with no additional active switches. IEEE Transactions on Power Electronics, 31(8), 5644-5654. (Year: 2015).*

Learning About Electronics, Inductor Current Calculator, Feb. 21, 2016, retrieved from https://web.archive.org/web/20160221030540/http://www.learningaboutelectronics.com/Articles/Inductor-current-calculator.php (Year: 2016).*

Qiu, Y., Wang, L., Liu, Y. F., & Sen, P. C. (Mar. 2015). A novel bipolar series Ripple compensation method for single-stage high-power LED driver. In 2015 IEEE Applied Power Electronics Conference and Exposition (APEC) (pp. 861-868). IEEE. (Year: 2015).*

International Search Report and the Written Opinion dated Jan. 11, 2018 from the International Searching Authority Re. Application No. PCT/IL2017/051119. (9 Pages).

International Preliminary Report on Patentability dated Apr. 11, 2019 from the International Bureau of WIPO Re. Application No. PCT/IL2017/051119. (6 Pages).

Supplementary European Search Report and the European Search Opinion dated Mar. 20, 2020 from the European Patent Office Re. Application No. 17855175.0. (7 Pages).

\* cited by examiner

ACTIVE ELECTRONIC EMULATION OF A PASSIVE CIRCUIT COMPONENT

RELATED APPLICATIONS

This application is a National Phase of PCT Patent Application No. PCT/IL2017/051119 having International filing date of Oct. 2, 2017, which claims the benefit of priority under 35 USC § 119(e) of U.S. Provisional Patent Application No. 62/403,153 filed on Oct. 2, 2016. The contents of the above applications are all incorporated by reference as if fully set forth herein in their entirety.

FIELD AND BACKGROUND OF THE INVENTION

The present invention, in some embodiments thereof, relates to active electronic emulation of a passive circuit component, thus an electronic capacitor or an electronic inductor, and, more particularly, but not exclusively, to a power supply provided with such an electronically emulated component.

Passive components comprise capacitors and inductors, and significantly contribute to the size, weight and cost of any power hardware. Moreover, electrolytic capacitors constitute the bottleneck in terms of reliability, lifetime and MTBF of any power conversion system. The amount of capacitance required is proportional to system rating while capacitance increase for ratings above several hundred watts is usually carried out by connecting more discrete capacitor units in parallel, thus reducing reliability even more.

Power converters may be AC-DC, DC-DC or AC to AC, and may have multiple terminals. For example there may be multiple power sources, say a solar generation plant and the mains power supply. Likewise there may be multiple loads possessing different characteristics. While the mains itself is regulated, other sources may provide less clean signals, or harmonics may be present.

The ripple in the power supply, hereinafter $\Delta P$ may be expected to have multiples of double the frequencies of the AC power supplies/loads and for good regulation, the capacitor placed across the power supply needs something like a millifarad per kilowatt of load. A millifarad capacitor is a very large electrolytic capacitor, and electrolytic capacitors have a relatively short lifetime. However the whole energy content of the capacitance is not in fact used. A small fraction of stored energy is used to dampen the ripple in the signal and the rest of the energy remains unused.

Passive Solutions

Combining DC link capacitor with a series-connected inductor creates a resonant filter, which suppresses the double grid frequency component if appropriately tuned. Nevertheless, the relatively low line frequency makes the resonant filter bulky, i.e. decreasing DC link capacitance implies an increase in the DC link inductance. If multiple grid frequency harmonics exist, for example in AC-AC converters, the system would require a capacitor-inductor couple for each significant harmonic frequency. In addition, capacitor voltage drop may be higher than the DC-link voltage, depending on the filter quality factor, calling for increased voltage rating of the capacitor.

Trade-Off with Power Factor

It is possible to reduce the DC link capacitance value by distorting the input current so that the power factor is reduced from unity down to the lowest allowable limit, e.g. 0.92 in Israel. Nevertheless, in addition to being cumbersome and computationally intensive, introducing harmonic content into grid current may violate the total harmonic content distortion grid code and thus cannot be considered as a universal solution. Moreover, achieved capacitance reduction is relatively insignificant.

Active Solutions

A promising group of capacitance reduction methods utilizes power electronics based auxiliary circuits, emulating DC link capacitance operation while utilizing much lower capacitance. The principle of operation is based on the observation that the amount of energy employed in the power matching process comprises only a small fraction of the energy stored in the DC link capacitor, i.e. a much lower capacitance is sufficient to absorb the double grid frequency power ripple. However, a high capacitance value is still necessary to satisfy the tight DC link ripple requirement. Consequently, decoupling energy and ripple requirements would allow releasing the bulk capacitor from the ripple limitation constraint thus considerably reducing its value. Such a solution may be accomplished by inserting an additional bidirectional power converter between the bulk capacitance and the DC link, and connecting the auxiliary unit either in parallel or in series.

The voltage on the energy storage capacitor is now allowed to vary in a much wider range according to power converter topology and rating. For example, if the converter uses buck-boost topology and the capacitor voltage is allowed to vary between 200V and 600V, the required capacitance would be 20 µF/kW, i.e. 40 times capacitance reduction would be achieved. It should be emphasized though that $v_C$ ripple restrictions must still be respected. Nevertheless, since the energy storage capacitor is now located elsewhere, the control system would have to take care of this constraint by itself.

In more detail, in active capacitance reduction a capacitor Ca is placed in parallel with a DC to DC convertor. The DC-DC convertor allows a new voltage to be set so that we do not need such a high rating. Thus a considerably lower value of capacitance can be used. For example a 1 mF capacitance may be replaced by a 10 µF, which can be ceramic and thus have a much higher lifetime.

However the solution is difficult to carry out in practice for a number of reasons. The first of these reasons is that the solution requires a summation of all the currents in the system to be sent through a high pass filter in order to eliminate and DC and provide a reference for the DC to DC convertor. Measuring the currents thus requires multiple sensors to be added to the system, and thus the solution is difficult to provide as a simple conversion. In addition, access to the measuring points may be difficult. Furthermore the system depends on the accuracy of a high pass filter that may effectively stop DC but allow double-base frequency components through perfectly, and such a filter is very difficult to realize, yet if not realized accurately then the reference signal on which the active capacitance reduction is based will be wrong.

Another solution, called Direct Voltage Regulation, dispenses with the measurement of currents, as the DC voltage is taken directly. The same issues apply of DC elimination and the high pass filter, and the solution only works for specific frequencies that are provided in advance.

Figure 1:
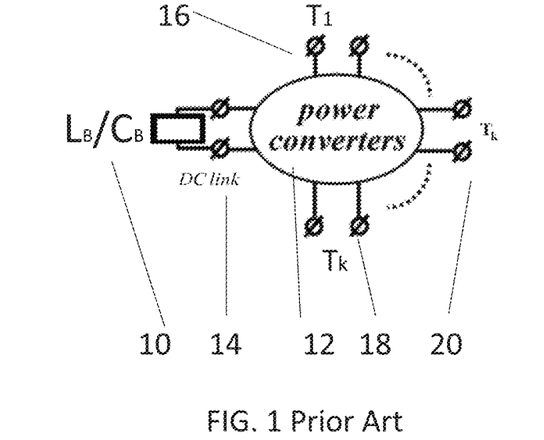
FIG. 1 is a diagram of a prior art power using a conventional capacitor/inductor.

The problem is now considered in greater detail. We consider a generalized K-terminal power conversion system with DC link, as shown in FIG. 1, in which one or more terminals may be directly connected to the DC link. Moreover, we assume that each terminal $T_k$, k=1 . . . K, is characterized by periodic yet non-sinusoidal behavior, given by:

$$v_k(t) = V_{k0} + \sum_{n=1}^{\infty} V_{kn} \sin(n\omega_k t + \theta_{kn}), \quad (1)$$

$$i_k(t) = I_{k0} + \sum_{n=1}^{\infty} I_{kn} \sin(n\omega_k t + \varphi_{kn}).$$

Thus, instantaneous power at each terminal is obtained as:

$$p_k(t) = v_k(t)i_k(t) = P_k + \Delta p_k(t) \quad (2)$$

with $P_k$ and $\Delta p_k$ denoting average (DC) and pulsating (zero average) power components. In the steady state, system power balance must be sustained, thus:

$$\sum_{k=1}^{K} P_k = 0, \sum_{k=1}^{K} \Delta p_k(t) + p_C(t) = 0 \quad (3)$$

must hold with $p_C(t)$ denoting the instantaneous power of the DC link capacitor. The former condition is assured by a dedicated controller, regulating the average value of the DC link voltage to a constant reference $V_{DC}^*$, while the latter demonstrates the necessity of a power matching element (typically realized by a capacitor) since in general:

$$\sum_{k=1}^{K} \Delta p_k(t) \neq 0. \quad (4)$$

Consequently, the steady-state DC link voltage is given by:

$$v_{DC}^{ss}(t) = \quad (5)$$

$$V_{DC}^* \sqrt{1 + \frac{2}{C_B(V_{DC}^*)^2} f_P(t)} \approx V_{DC}^* + \underbrace{\frac{1}{C_B V_{DC}^*} f_P(t)}_{\Delta v_{DC}(t)} = V_{DC}^* + \Delta v_{DC}(t)$$

with:

$$f_P(t) = \int_0^t \sum_{k=1}^{K} \Delta p_k(\tau) d\tau \quad (6)$$

and $\Delta v_{DC}(t)$ denoting the instantaneous DC link ripple. Since $f_P(t)$ depends on power system sources/loads and cannot be altered from the DC link side, the value of the DC link capacitance is the only tunable parameter, influencing DC link ripple magnitude. The latter is typically bounded by the system power converters' operational constraints as well as by the DC link capacitor rated voltage value, implying utilizing electrolytic capacitors in systems rated above several tens of watts. Assuming DC link ripple magnitude restrictions given by:

$$v_{DC}^{MIN} < v_{DC}^{ss}(t) < v_{DC}^{MAX}, \quad (7)$$

the required bulk DC link capacitance value may be determined from:

$$C_B = \frac{1}{V_{DC}^*} \max\left(\frac{\max_t f_P(t)}{(v_{DC}^{MAX} - V_{DC}^*)}, \frac{\min_t f_P(t)}{(v_{DC}^{MIN} - V_{DC}^*)}\right). \quad (8)$$

Obviously, tightening the limits of (7) would increase $C_B$ while raising $C_B$ would decrease the DC link ripple. It is interesting to note that letting:

$$C_B \to \infty \quad (9)$$

in (5) yields $$\Delta v_{DC}(t) \to 0, v_{DC}^{ss}(t) \equiv V_{DC}^* \quad (10)$$

which is obviously non-feasible when utilizing a passive power matching element. It should be stated that in power conversion systems rated more than 1 kW the required capacitance is typically realized by several elements connected in parallel, which further deteriorates the reliability.

The above gives the general idea and numerous active capacitance reduction solutions have been proposed in the literature. The solutions tend to use the same hardware but significantly differ in underlying control structures, feedback variables, algorithms, and, consequently, performance. The proposed control approaches may be divided into three main groups as follows.

The first and probably the most popular group of active capacitance reduction solutions (often referred to as ripple eliminators) is based on simultaneous control of both main power converter and auxiliary power converter, i.e. the converter decoupling the energy storage capacitor from the DC link. The main drawback of these solutions is the fact that the ripple eliminator cannot be operated in a plug-and-play fashion and the main power converter control structure must be re-designed in order to cope with the ripple eliminator (RE) dynamics. An enhanced version of such a solution has been demonstrated, where the RE control algorithm does not affect the main converter controller; nevertheless it requires input voltage sensing for correct operation and hence cannot be considered as a plug-and-play device.

The second group of active solutions contains methods, which in addition to simultaneously controlling both main and auxiliary power converters, requires modification of the main power converter hardware and is unlikely to be considered, as it is application specific and thus fails to constitute a practical DC link capacitance reduction solution.

The third and the smallest yet most promising group of active capacitance reduction solutions contains methods supporting plug-and-play operation, affecting neither hardware nor control structure of the main converter. The method is based on a series-connected ripple eliminator, allowing to correct PFC output voltage ripple with a series-connected device. Nevertheless, the authors have assumed a 220 Vrms grid without taking into account the possibility of 15% grid voltage rise which may occur in practice. During such an event, the proposed circuit would not operate correctly.

Another method contains a parallel-connected ripple eliminator, regulated by an advanced repetitive control technique. Despite plug-and-play operation, the ripple elimination controller requires sensing PFC output current for correct operation. Moreover, these methods were developed for single phase AC/DC power supplies only and are application specific rather than generic.

In summary, different approaches to reduce the capacitance employing an electronic capacitor-like system have been proposed. Nevertheless, all the approaches are application-specific, employing different application specific control systems.

SUMMARY OF THE INVENTION

The present embodiments relate to an electronic unit that appears to external circuitry to be a capacitor or inductor of a given value but internally has different, typically smaller and more manageable, values. The unit may comprise a capacitor or inductor that is decoupled from the device terminals and the external circuit conditions. In particular the capacitor may appear from the external point of view to be much larger or for that matter much smaller than it actually is internally. A control system may include capacitance or inductance emulation, as will be described herein below and the value emulated may be variable.

According to an aspect of some embodiments of the present invention there is provided an electronic emulation component for actively emulating a passive component having capacitance or inductance of a desired value, the emulation component comprising:

a pair of terminals for connection to an external circuit and across which the desired capacitance appears;

a power convertor;

a controller connected to the power converter, the controller configured to provide a control signal to the power converter which control signal has a value based at least in part on the desired value; and a passive component isolated from the pair of terminals by the convertor.

In an embodiment, the power convertor comprises a control unit.

In an embodiment, the power convertor comprises an emulator for emulating the capacitance or inductance.

In an embodiment, the emulator is configured to provide the control signal to the power converter.

In an embodiment, the control signal is changeable, thereby to allow the electronic component to vary the value of the component being emulated.

In an embodiment, the component being emulated is a capacitor.

In an embodiment, the component being emulated is an inductor.

In an embodiment, the passive component isolated from the pair of terminals by the convertor has a value of capacitance or inductance which is independent of the desired value.

In an embodiment, the emulator is configured to provide an emulation of a capacitance $C_B$ at the pair of terminals by providing a DC reference voltage ($v_{DC}^*$) to the power convertor at a control current $i_C$, wherein the reference voltage is given by:

$$v_{DC}^* = \frac{1}{C_B} \int i_C(t) dt.$$

In an embodiment, the emulator is configured to provide an emulation of an inductance $L_B$ at the pair of terminals by providing a DC reference current ($i_{DC}^*$) to the power convertor at a control current $v_C$, wherein the reference current is given by:

$$i_{DC}^* = \frac{1}{L_B} \int v_C(t) dt.$$

In an embodiment, the control current is calculated based on internal losses of the capacitance being emulated.

In an embodiment, the control voltage is calculated based on internal losses of the inductance being emulated.

An embodiment may comprise a regulator for regulating current from the emulator to provide a control signal.

An embodiment may comprise a regulator for regulating voltage from the emulator to provide a control signal.

An embodiment may comprise a modulator for modulating the control signal from the regulator to provide a switching sequence for the power convertor.

A power supply circuit may be constructed using the electronic emulation component described herein.

In an embodiment, the electronic emulation component is connected across the power supply circuit to smooth ripples.

According to a second aspect of the present invention there is provided a method for actively emulating a first capacitance/inductance across a pair of terminals, comprising:

providing a pair of terminals;

providing a capacitor having a second capacitance different from the first capacitance;

placing a decoupler between the pair of terminals and the capacitor;

controlling the decoupler using a reference signal having a value selected at least in part based on a value of the first capacitance/inductance.

An embodiment may use a control signal to control the decoupler.

In an embodiment, the control signal comprises a capacitance/inductance emulation component.

In an embodiment, the capacitance/inductance emulation component comprises a value of all or part of the control signal which is based at least in part on a value of the desired capacitance/inductance.

In an embodiment, the capacitance/inductance emulation component is configured to provide an emulation of a capacitance/inductance $C_B/L_B$ at the pair of terminals by providing a DC reference voltage/current to the decoupler at a control current/voltage $i_C/v_C$, wherein the reference voltage is given by:

$$v_{DC}^* = \frac{1}{C_B} \int i_C(t) dt / i_{DC}^* = \frac{1}{L_B} \int v_C(t) dt.$$

In an embodiment, the control current is calculated based on internal losses of the capacitance/inductance being emulated.

An embodiment may encompass regulating current/voltage of the capacitance/inductance emulation to provide the control signal.

An embodiment may modulate the control signal to provide a switching sequence for the decoupler.

The decoupler may be operated as a power converter.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF SPECIFIC EMBODIMENTS OF THE INVENTION

The present invention, in some embodiments thereof, relates to electronic emulation of a passive circuit component, thus an electronic capacitor or an electronic inductor, and, more particularly, but not exclusively, to a power supply provided with such an electronically emulated component.

The present embodiments may replace large passive components by an electronic system, consisting of a much smaller passive component and a power electronic converter. In case of capacitors, embodiments may achieve significant reduction in the capacitance value, allowing in some cases to employ a single ceramic/film capacitor in place of a bank of electrolytic capacitors, thus leading to much higher reliability, MTBF and lifetime. In case of inductors, inductor-like operation may be achieved utilizing capacitors and electronics switches only.

In the case of a capacitor/inductor, the present embodiments may provide a two-terminal device consisting of capacitor $C_P$, power converter and control system, capable of emulating terminal behavior of any finite capacitance $C_B$ (higher or lower than $C_P$) or finite inductance $L_B$. Moreover, emulated capacitance/inductance value $C_B/L_B$ may be instantaneously varied according to an external control signal. On the other hand, energy storage capabilities of the proposed device equal these of the capacitor $C_P$, i.e. the value of emulated capacitance/inductance is decoupled from the device energy storage capabilities, by contrast with a regular capacitor/inductor where the two are coupled.

The device of the present embodiments may replace existing capacitors/inductors, operating as short-time energy storage in a plug-and-play fashion, utilizing relatively lower capacitance thus increasing reliability and lifetime while in many cases decreasing weight and volume.

The present embodiments may thus enable the weight and volume of power conversion systems to be decreased, while increasing reliability, MTBF and lifetime.

For purposes of better understanding some embodiments of the present invention, as illustrated in FIGS. 2-7B of the drawings, reference is first made to the construction and operation of a power supply with a conventional capacitor/inductor as illustrated in FIG. 1.

FIG. 1 illustrates the conventional situation in which a capacitor/inductor $C_B/L_B$ 10 is placed across the terminals of a power convertor 12 via a DC link 14. The task of the power converter 12 is to obtain power from a source Tl, 16, and supply the power under different conditions to output terminals Tk 18 and 20.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Figure 2:
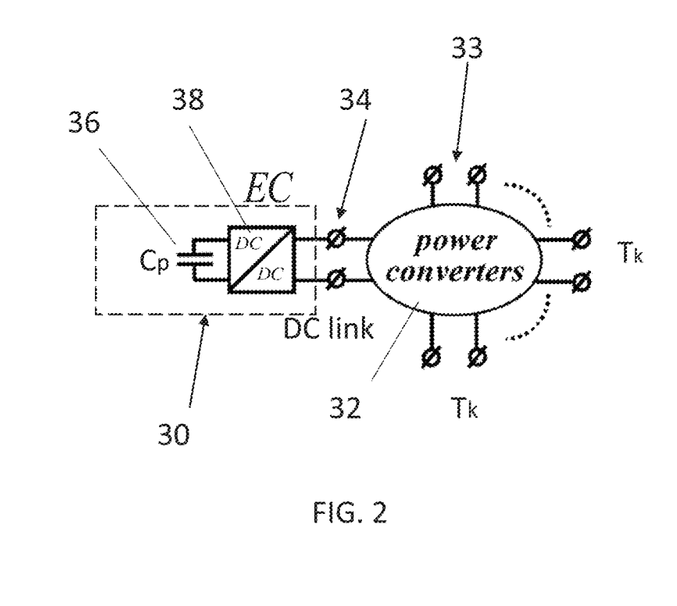
FIG. 2 is a simplified diagram showing an electronic capacitor/inductor attached to a power supply according to the present embodiments.

Reference is now made to FIG. 2, which is a simplified diagram illustrating an electronic capacitor/inductor (ECI) 30 according to a first embodiment of the present invention. The ECI 30 may be an electronic capacitance/inductance component for emulating a desired capacitance/inductance. As shown in FIG. 2 the capacitance/inductance to be emulated is that needed by power converter 32 to deal with the power source across terminals 33. The component 30 comprises a pair of terminals 34 for connection to the external circuit 32 and across which the desired capacitance/inductance appears. Capacitor Cp 36 is isolated from the pair of terminals 36 by a decoupler 38, which may itself be a power supply, as shown a DC-DC power supply and isolator.

Figures 3, 4A, 4B, 5:
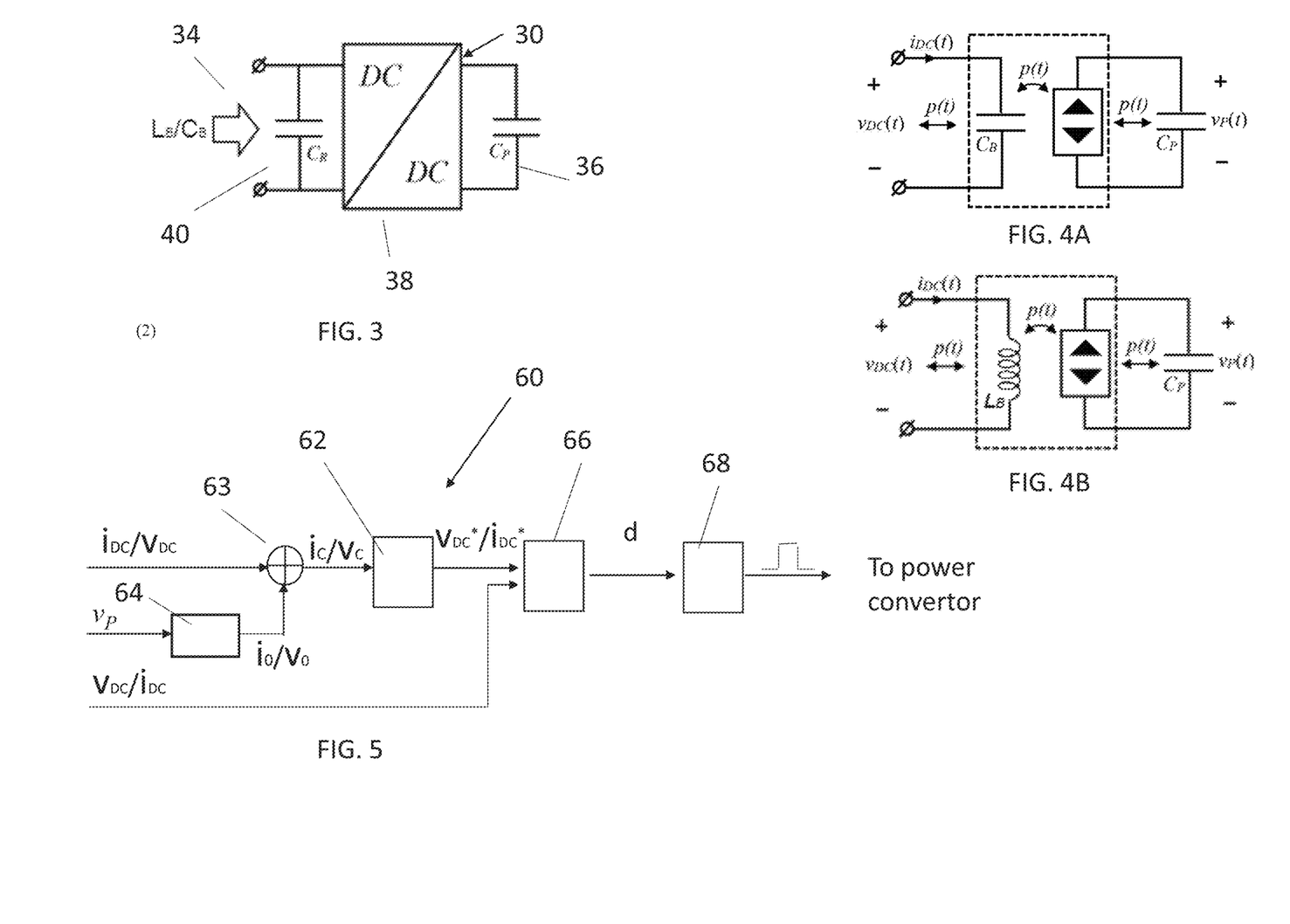
FIG. 3 is a simplified schematic circuit diagram of the electronic capacitor component of the present embodiments.
FIG. 4A is a power-level equivalent diagram of the circuit of FIG. 3 when emulating a capacitor.
FIG. 4B is a power-level equivalent diagram of the circuit of FIG. 3 when emulating an inductor.
FIG. 5 is a simplified diagram of a control circuit in the electronic capacitor/inductor of FIGS. 2 and 3.

FIG. 3 shows in greater detail the component 30. Terminals 34 are connected across decoupler 38, and capacitor $C_P$ 36 is connected on the other side of the decoupler so as to be decoupled from the terminals 34. As before, decoupler 38 is shown as a DC-DC power supply. Additional capacitor $C_R$ 40 is connected across the terminals to deal with switching ripple, and capacitance/inductance to be emulated $C_B/L_B$ appears across the terminals to be seen by the external circuit.

FIGS. 4A and 4B are power-level equivalent circuits of FIG. 3 and will be discussed herein below.

Reference is now made to FIG. 5, which is a simplified diagram illustrating control unit 60 for controlling the decoupler 38. Decoupler 38 is provided with a driving signal, and the driving signal is provided by the control unit 60. The control unit 60 comprises capacitance/inductance emulator 62, which provides a control signal for the decoupler 38 which control signal has a value based at least in part on a value of the desired capacitance/inductance $C_B/L_B$.

The emulator may enable the emulation of the capacitance $C_B$ at the pair of terminals 34 by providing a DC reference voltage ($v_{DC}{}^*$) to the decoupler 38 at a control current $i_C$, wherein the reference voltage is given by:

$$v_{DC}^* = \frac{1}{C_B} \int i_C(t)dt$$

or, the emulator may enable the emulation of the inductance $L_B$ at the pair of terminals 34 by providing a DC reference current ($i_{DC}^*$) to the decoupler 38 at a control voltage $v_C$, wherein the reference voltage is given by:

$$i_{DC}^* = \frac{1}{L_B} \int v_C(t) dt$$

The integration may be carried out by integrator 63.

The control unit may further include a loss compensation unit 64, which generates an initial control current/voltage which is calculated based on internal losses of the capacitance/inductance $C_B/L_B$ being emulated.

The control unit may further include a regulator 66, which regulates the current/voltage from the capacitance/inductance emulator to provide a regulated control signal.

The control unit 60 may further include a modulator 68, which modulates the regulated control signal from the regulator to provide a switching sequence for the decoupler, which may be a power convertor.

The electronic capacitance/inductance component may usefully be connected across a power supply circuit to smooth ripples. For power supply circuits with a relatively high rating, the decoupling between the capacitor and the terminals effectively allows a relatively small capacitor to emulate the much larger capacitor/inductor that the power supply needs.

Figure 6:
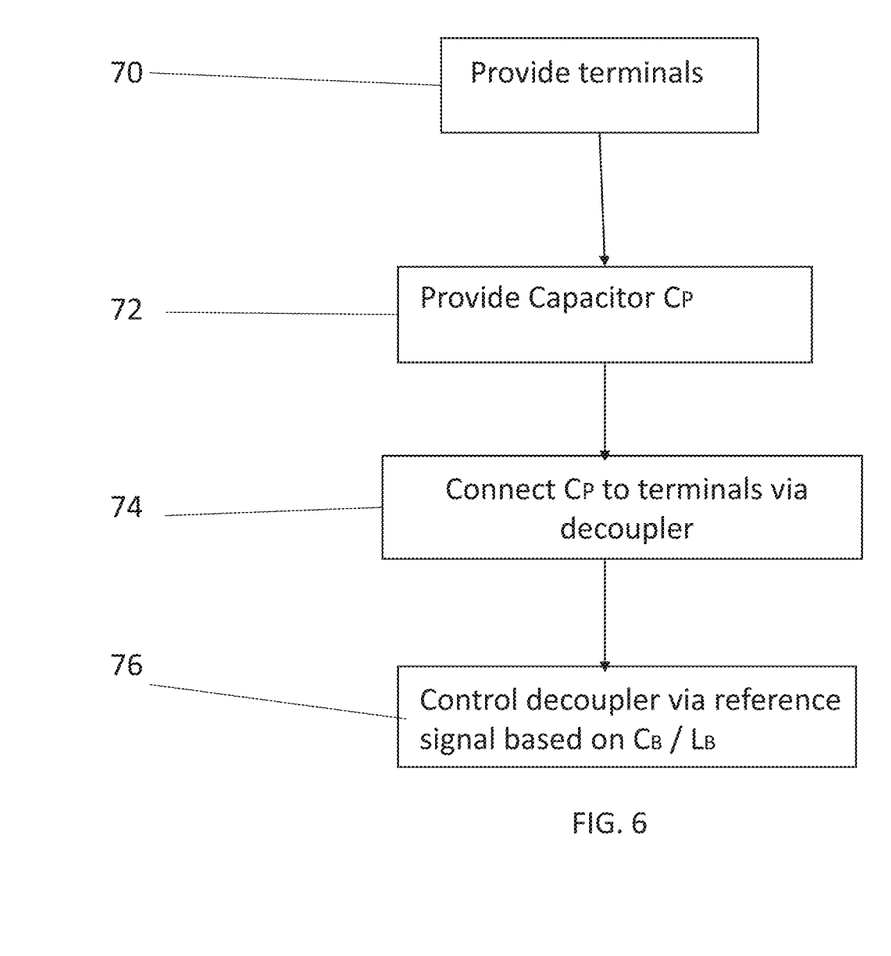
FIG. 6 is a simplified flow chart illustrating a method of emulating a capacitance/inductance according to embodiments of the present invention.

Reference is now made to FIG. 6, which is a flow chart that illustrates a method of providing an emulated capacitance/inductance value using a different capacitance value according to embodiments of the present invention.

A pair of terminals 70 provide an external connection to the device. A capacitor having a second capacitance not being the capacitance/inductance to be emulated is then provided 72 and connected 74 to the terminals via a decoupler such as a DC-DC power supply.

The decoupler is then controlled as a power supply using a reference signal having a value selected at least in part based on a value of the capacitance/inductance to be emulated.

The device according to the present embodiments thus provides what appears to be the capacitance/inductance being emulated, across its output terminals and since the effect appears across the terminals, the terminals can simply be attached across an existing power supply. The device in fact provides the emulation electronically with the help of an internal decoupled capacitance $C_P$ which in many cases can be much smaller than the capacitance/inductance being emulated. If the device is used with mains voltage equipment such as power supplies, then the capacitor used need not be electrolytic and can be much smaller, and cheaper than those used in the prior art and thus have a longer expected lifetime.

In greater detail, a smaller capacitance may be sufficient, as we note that according to above equation (7), bulk capacitance stores a maximal energy of:

$$E_B^{MAX} = \frac{1}{2} C_B (v_{DC}^{MAX})^2, \quad (11)$$

out of which only a small fraction given by:

$$E_B^{USED} = \frac{1}{2} C_B ((v_{DC}^{MAX})^2 - (v_{DC}^{MIN})^2) \quad (12)$$

is actually used. For a typical case of $390V < v_{DC}^{ss}(t) < 410V$, less than 10% of stored energy is utilized. Therefore, a much smaller capacitor would be sufficient to supply the energy requirement than that required if the DC link ripple constraint did not exist. The electronic capacitor of the present embodiments, see FIGS. 2-6, allows physical decoupling of the power matching capacitor from the DC link, thus releasing its voltage from the ripple constraints given by (7). The decoupling leads to significant reduction of the power matching capacitance, i.e. $C_P \ll C_B$ in FIG. 2. It is further shown that any finite $C_B$ may be emulated by the electronic capacitor device of the present embodiments, using the circuit shown in FIG. 3.

In FIG. 3, $C_R$ 40 is a small ceramic capacitor which may be present at the DC link side terminals 34 of the electronic capacitor to absorb switching ripple. Note that even though capacitor $C_P$ operates as a power matching element, its voltage ripple restrictions are much more relaxed than in equation (7) above.

Neglecting the energy stored in $C_R$, $C_P$ absorbs the pulsating power component, as shown in FIGS. 4A and 4B, i.e. its steady-state voltage would be given by:

$$v_P^{ss}(t) \approx V_P^* + \underbrace{\frac{1}{C_P(V_P^*)^2} f_P(t)}_{\Delta v_P(t)} = V_P^* + \Delta v_P(t) \quad (13)$$

with $V_P^*$ and $\Delta v_P(t)$ denoting constant reference value and instantaneous ripple of $v_P(t)$, respectively. It should be emphasized that magnitude constraints of $\Delta v_P(t)$ are related to electronic capacitor operational requirements as well as the rated voltage value of $C_P$ while being independent on the rest of system power converters' operational restrictions.

Assuming:

$$v_P^{MIN} < v_P^{ss}(t) < v_P^{MAX}, \quad (14)$$

the value of the auxiliary power matching capacitance is determined from:

$$C_P = \frac{1}{V_P^*} \max \left( \frac{\max_t f_P(t)}{v_P^{MAX} - V_P^*}, \frac{\min_t f_P(t)}{v_P^{MIN} - V_P^*} \right), \quad (15)$$

and minimized by setting:

$$V_P^* = \sqrt{\frac{1}{2}((v_P^{MAX})^2 + (v_P^{MIN})^2)}. \quad (16)$$

It is interesting to note that DC link ripple is independent of the value of $C_P$ and is governed by the emulated capacitance value and regulation abilities of electronic capacitor converter only. Hence, in case the DC link voltage controller is capable of satisfying (5), capacitance $C_B$ is emulated by the electronic capacitor, from the DC link point of view, while actually utilizing the total capacitance of $C_R + C_P$.

Control System

The electronic capacitor/inductor device comprises a control system as illustrated in FIG. 5. The controller consists of three main subsystems: capacitance/induction emulation 62, loss compensation 64, voltage/current regulation 66 and modulator 68 as shown in FIG. 5.

The emulation block 62 may emulate the capacitance/inductor terminal voltage/current behavior by setting the DC link voltage/current reference to be based at least in part on the capacitance/inductance to be emulated $C_B/L_B$ and more particularly as:

$$v_{DC}^* = \frac{1}{C_B}\int i_C(t)dt \text{ or } i_{DC}^* = \frac{1}{L_B}\int v_C(t)dt \qquad (17)$$

Loss Compensation

The loss compensation block 64 calculates the DC current/voltage term drawn by the electronic capacitor/inductor to compensate internal losses as:

$$i_0 = f_1(v_P^* - v_P) \text{ or } v_0 = f_2(v_P^* - v_P) \qquad (18)$$

where $f_1(\bullet)$ and $f_2(\bullet)$ are the compensating functions.

Voltage/Current Regulation

The voltage/current regulation block 66 calculates the control signal d to the power converter as:

$$d = g_1(v_{DC}^* - v_{DC}) \text{ or } d = g_2(i_{DC}^* - i_{DC}) \qquad (19)$$

where $g_1(\bullet)$ and $g_2(\bullet)$ are the regulation functions.

Modulator

The modulator block 68 modulates the control signal d into switching sequence sent to the power converter.

Example

Figure 7A:
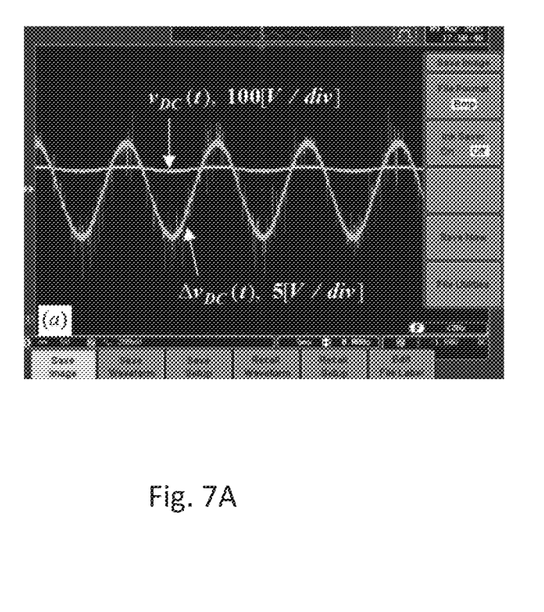
FIGS. 7A and 7B are a comparative example of power regulation using a large capacitor and using emulation according to the present embodiments.
Figure 7B:
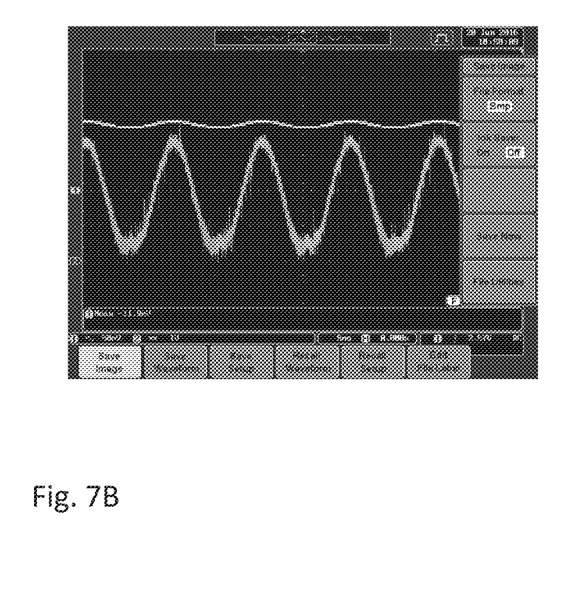

As an example, consider (for brevity and clarity) a unity-power-factor operating single-phase rectifier, driving a DC load. Hence, $$p_C(t) = P_L \cos 2\omega_1 t \qquad (20)$$

with $P_L$ and $\omega_1$ symbolizing load power and grid frequency, respectively. In case a bidirectional buck-boost electronic capacitor converter ($v_P < v_{DC}$) is utilized, power matching capacitance may ideally be reduced to:

$$C_P = \frac{P_L}{(\sqrt{2}-1)\omega_1(V_{DC}^*)^2} \qquad (21)$$

for $v_P^{MIN} = 0$, $v_P^{MAX} = V_{DC}^*$. In reality, somewhat higher matching capacitance may be selected to allow safety margins and improve robustness against abrupt load changes. Steady state input voltage and output current of the ACRC are then obtained as $$v_P(t) = V_P^* \sqrt{1 + \frac{P_L}{C_P \omega_1 (V_P^*)^2} \sin 2\omega_1 t} \qquad (22)$$

and $$i_{DC}(t) = \frac{P_L}{V_{DC}^*} \cos 2\omega_1 t, \qquad (22)$$

respectively, FIG. 7A demonstrates experimental results with $P_L = 350$ W and $C_B = 270$ μF while FIG. 7B demonstrates experimental results with $P_L = 350$ W, $C_P = 22$ μF and emulated capacitance of 270 μF. Apparently, the results are very close, verifying the proposed method.

The terms "comprises", "comprising", "includes", "including", "having" and their conjugates mean "including but not limited to".

The term "consisting of" means "including and limited to".

The term "consisting essentially of" means that the composition, method or structure may include additional ingredients, steps and/or parts, but only if the additional ingredients, steps and/or parts do not materially alter the basic and novel characteristics of the claimed composition, method or structure.

As used herein, the singular form "a", "an" and "the" include plural references unless the context clearly dictates otherwise.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub combination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. An electronic emulation component for actively emulating a passive component having capacitance or inductance of a value desired to be emulated, the emulation component comprising:

a pair of terminals for connection to an external circuit and across which said desired value to be emulated appears, thereby to provide said value to be emulated to said external circuit;

a power convertor comprising a control unit and an emulator, the emulator for emulating said capacitance or said inductance;

a controller connected to said power converter, said controller configured to provide a control signal to said power converter which control signal is a DC reference signal having a value equal to said value desired to be emulated; and a passive component having a value of capacitance or inductance smaller than said value desired to be emulated, the passive component isolated from said pair of terminals by said convertor, wherein said emulator is configured to provide an emulation of a capacitance $C_B$ at said pair of terminals by providing a DC reference voltage ($v_{DC}^*$) to said power convertor at a control current $i_C$, wherein said reference voltage is given by:

$$v_{DC}^* = \frac{1}{C_B}\int i_C(t)dt.$$

2. The electronic emulation component of claim 1, wherein said emulator is configured to provide said control signal to said power converter.

3. The electronic emulation component of claim 2, wherein said control signal is changeable, thereby to allow said electronic component to vary the value of the component being emulated.

4. The electronic emulation component of claim 1, wherein said component being emulated is one member of the group consisting of a capacitor and an inductor.

5. The electronic emulation component of claim 1 wherein said passive component isolated from said pair of terminals by said convertor has a value of capacitance or inductance which is independent of said desired value.

6. An electronic emulation component for actively emulating a passive component having capacitance or inductance of a value desired to be emulated, the emulation component comprising:
a pair of terminals for connection to an external circuit and across which said desired value to be emulated appears, thereby to provide said value to be emulated to said external circuit;
a power convertor comprising a control unit and an emulator, the emulator for emulating said capacitance or said inductance;
a controller connected to said power converter, said controller configured to provide a control signal to said power converter which control signal is a DC reference signal having a value equal to said value desired to be emulated; and
a passive component having a value of capacitance or inductance smaller than said value desired to be emulated, the passive component isolated from said pair of terminals by said convertor, wherein said emulator is configured to provide an emulation of an inductance $L_B$ at said pair of terminals by providing a DC reference current ($i_{DC}^*$) to said power convertor at a control current $v_C$, wherein said reference current is given by:

$$i_{DC}^* = \frac{1}{L_B} \int v_C(t)dt.$$

7. The electronic emulation component of claim 1, wherein said control current is calculated based on internal losses of said capacitance being emulated.

8. The electronic emulation component of claim 6, wherein said control voltage is calculated based on internal losses of said inductance being emulated.

9. The electronic emulation component of claim 1, further comprising a regulator for regulating current from the emulator to provide a control signal.

10. The electronic emulation component of claim 1, further comprising a regulator for regulating voltage from the emulator to provide a control signal.

11. The electronic emulation component of claim 9, further comprising a modulator for modulating said control signal from the regulator to provide a switching sequence for said power convertor.

12. The electronic emulation component of claim 1 connected into a power circuit.

13. The electronic emulation component of claim 12, connected across said power supply circuit to smooth ripples.

14. A method for actively emulating a first capacitance or inductance such that a value of said first capacitance or inductance appears across a pair of terminals to an external circuit, comprising:
providing a pair of terminals;
providing a capacitance or inductance having a second capacitance different from and smaller than said first capacitance or inductance;
placing a decoupler between said pair of terminals and said capacitor;
controlling said decoupler using a control signal and further controlling said decoupler using a DC reference signal having a value equal to said value of said first capacitance or inductance to appear across said pair of terminals, and wherein said control signal comprises a capacitance emulation component or an induction emulation component, wherein said capacitance or inductance emulation component is configured to provide an emulation of a capacitance or inductance $C_B$ or $L_B$ at said pair of terminals by providing a DC reference voltage or current to said decoupler at a control current or voltage $i_C$ or $v_C$, wherein said reference voltage is given by:

$$v_{DC}^* = \frac{1}{C_B} \int i_C(t)dt \quad \text{or} \quad i_{DC}^* = \frac{1}{L_B} \int v_C(t)dt.$$

15. The method of claim 14, further comprising using a control signal to control said decoupler.

16. The method of claim 15, wherein said control signal comprises a capacitance or inductance emulation component.

17. The method of claim 14, wherein said capacitance or inductance emulation component comprises a value of all or part of said control signal which is based at least in part on a value of said desired capacitance or inductance.

18. The method of claim 14, wherein said control current is calculated based on internal losses of said capacitance or inductance being emulated.

19. The method of any one of claim 15, further comprising regulating current or voltage of the capacitance or inductance emulation to provide said control signal.

20. The method of claim 19, further comprising modulating said control signal to provide a switching sequence for said decoupler.

21. The method of claim 20, comprising operating said decoupler as a power converter.

* * * * *